United States Patent [19]

Grubb, III

[11] Patent Number: 5,046,138
[45] Date of Patent: Sep. 3, 1991

[54] SELF-ALIGNING ANALOG LASER TRANSMITTER

[75] Inventor: David Grubb, III, Doylestown, Pa.

[73] Assignee: General Instrument Corporation, New York, N.Y.

[21] Appl. No.: 371,336

[22] Filed: Jun. 26, 1989

[51] Int. Cl.$^5$ ............................................. H04B 10/04
[52] U.S. Cl. .................................................. 359/188
[58] Field of Search .................................. 455/609-611, 455/613, 618; 372/31, 33

[56] References Cited

U.S. PATENT DOCUMENTS

| | | | |
|---|---|---|---|
| 4,008,390 | 2/1977 | Runge | 250/199 |
| 4,009,385 | 2/1977 | Sell | 250/199 |
| 4,369,525 | 1/1983 | Breton | 455/618 |
| 4,399,566 | 8/1983 | Roullet | 455/618 |
| 4,504,976 | 3/1985 | Beaudet | 455/618 |
| 4,612,671 | 9/1986 | Giles | 455/609 |
| 4,621,282 | 11/1986 | Ahern | 358/86 |

FOREIGN PATENT DOCUMENTS

| | | | |
|---|---|---|---|
| 0009446 | 1/1983 | Japan | 455/618 |
| 0229542 | 11/1985 | Japan | 455/611 |
| 0078626 | 4/1988 | Japan | 455/618 |

OTHER PUBLICATIONS

Smith, "Laser Level Control Circuit for High Bit Rate Systems Using a Slope Detector", *Electronic Letters*, 11-23-78, vol. 14, #24.

*Primary Examiner*—Curtis Kuntz
*Assistant Examiner*—L. Pascal
*Attorney, Agent, or Firm*—Barry R. Lipsitz

[57] ABSTRACT

Apparatus and a method are provided for aligning an analog laser transmitter. Operational characteristics of the laser are determined. These characteristics are used to derive the power level required of a communication signal to properly modulate the laser for communication across an optical fiber. The magnitude of an input communication signal is then adjusted to the derived level, and maintained at this level for proper modulation. The alignment is performed upon the replacement of laser components in the field. The alignment may also be periodically effected to compensate for normal degradation of laser components over time.

16 Claims, 5 Drawing Sheets

SELF-ALIGNING ANALOG LASER TRANSMITTER

BACKGROUND OF THE INVENTION

The present invention relates to lasers, and more particularly to a laser transmitter for communication of signals across a fiber optic network, such as a cable television network.

A cable television network is primarily designed to distribute television signals from a "headend" to the homes of individual subscribers. In the past, cable television networks have utilized coaxial cable comprising an inner conductor and a conductive outer shield. At the present time, a new technology is evolving wherein cable television signals are transmitted over fiber optic cables. In fiber optic systems, light from a laser is modulated with a radio frequency (RF) television signal for transmission across a fiber optic cable. An example of a cable television system in which optical fibers connect the headend to a switching point from which the signal is connected to a subscriber's home, is provided in U.S. Pat. No. 4,621,282 to Ahern, entitled "Transmitting Stereo Audio Programs in Cable TV Systems". In the system of that patent, signals are transmitted over the fiber optic cable in digital as opposed to analog form.

In implementing a cable television network utilizing fiber optic technology and laser transmitters, replaceable laser modules may be used. If a laser module burns out, or otherwise becomes inoperable, it can be replaced in the field by substituting a new laser module therefor. A problem arises, however, in that different laser modules have different characteristics. Alignment of a transmitter in the field upon replacement of a laser module can be complicated and time consuming.

It would be advantageous to have a laser module that can be replaced in the field, with minimum effort, and no need for time consuming alignment to compensate for the specific characteristics of the new laser module. It would be further advantageous to provide a laser transmitter which adjusts itself upon the installation of a new laser module, to compensate for the characteristics of the module.

The present invention relates to such a laser transmitter and to a method for aligning a laser transmitter to provide proper modulation of a signal for fiber optic communication.

SUMMARY OF THE INVENTION

In accordance with the present invention, apparatus is provided for aligning an analog laser transmitter to provide proper modulation of a signal for fiber optic communication. The laser is modulated by a communication signal, and means are provided for monitoring the magnitude of the communication signal. Means are coupled to the laser for determining operational characteristics thereof. The operational characteristics can comprise, for example, the slope efficiency of the laser and the rated output power of the laser. Such characteristics might alternately include the input power magnitude required to operate the laser at 100% modulation.

Means are provided for deriving, from the determined operational characteristics, the level required of the communication signal to properly modulate the laser for communication across a fiber optic cable. Means are provided for adjusting the magnitude of the communication signal to said level.

The laser will typically require an input bias current to produce an output. Where the operational characteristics to be determined include the slope efficiency of the laser, the determining means can comprise means for measuring the bias current $I_1$ of said laser at one output power level $P_1$ and for measuring the bias current $I_2$ of said laser at another output power level $P_2$. Means are provided for computing the slope efficiency SE from the relationship:

$$SE = \frac{P_2 - P_1}{I_2 - I_1}$$

Where the laser has a rated output power $P_{nom}$ and an input impedance R, the deriving means can comprise means for calculating the level L required of the communication signal to properly modulate the laser, for a desired modulation index M, from the relationship:

$$L = \tfrac{1}{2} * (P_{nom}/SE)^2 * R * M^2$$

In an alternate embodiment, the slope efficiency can be determined by measuring the power levels $P_1$ and $P_2$ instead of the bias currents $I_1$ and $I_2$.

The operational characteristics determined by the determining means can, as noted above, alternately comprise the input power magnitude required to operate the laser at 100% modulation. This input power magnitude can be determined by applying a test tone to modulate the laser. The power of the test tone is gradually increased from a relatively low power to a higher power. Means are provided for monitoring a bias current coupled to the laser during the application of the test tone. Means coupled to the monitoring means detect a change in the bias current due to over-modulation of the laser by the test tone. The test tone power is determined when a change in the bias current is detected by the detecting means. The magnitude of the determined test tone power at this point is the input power magnitude required to operate the laser at 100% modulation. Means are provided for then computing, from this input power magnitude, the power level required of the communication signal to operate the laser at a desired modulation level. A computer processor or other means may then adjust the power of the communication signal to the required power.

A laser bias current $I_{bias}$ (above the threshold current $I_{th}$), to be applied to the laser when communicating over a fiber optic cable, can be computed according to the formula:

$$I_{bias} = \frac{P_{nom}}{SE},$$

and applied to the laser during fiber optic communication.

DETAILED DESCRIPTION OF THE INVENTION

In the laser transmitter apparatus of the present invention, laser characteristics are measured and used to determine the level required of an input communication signal to properly modulate a laser for communication across a fiber optic cable or other transmission medium such as a free space optical link.

Figure 1:
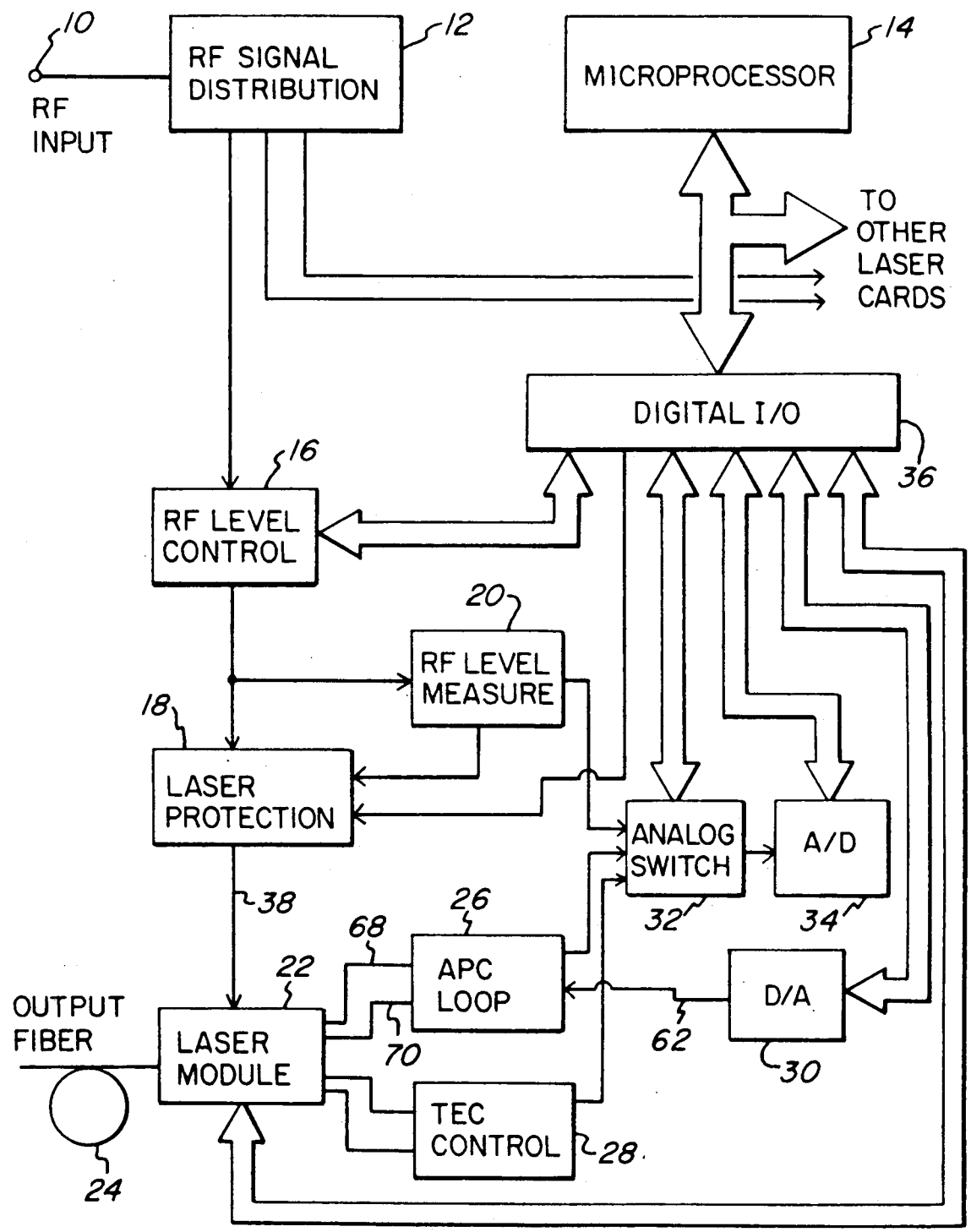
FIG. 1 is a block diagram of analog laser transmitter apparatus according to the present invention.

Turning to FIG. 1, the laser transmitter in a preferred embodiment is modulated by an RF input signal applied to terminal 10. An RF signal distribution circuit 12 receives the RF input signal and distributes it to one or more laser cards contained in a headend apparatus. Each laser card is used to transmit the input signal over a separate fiber in a fiber optic cable.

A microprocessor 14 is provided to control the operation of the laser transmitter(s). Microprocessor 14 communicates with individual components on each laser card via a digital I/O interface 36 provided on each card.

In the laser card shown in the block diagram of FIG. 1, an RF level control circuit 16 receives the RF input signal from distribution circuitry 12. RF level control circuitry 16 can comprise a conventional P-I-N diode attenuator, in which an input signal can be variably attenuated by changing the current through the P-I-N diode. Other types of variable attenuation circuits could alternately be used, and such circuits are well known in the art. Control of the attenuation level is handled by microprocessor 14 via digital I/O interface 36.

A laser protection circuit 18 is provided to ensure that the RF input signal is maintained within a level that will not destroy the laser. RF level measurement circuitry 20 operates in conjunction with laser protection circuitry 18 in a conventional manner. RF level measurement circuitry 20 is also used in accordance with the present invention to maintain the power level of the RF communication signal input to the laser at a magnitude required to properly modulate the laser for communication across an optical fiber.

The communication signal is coupled from laser protection circuitry 18 to laser module 22, which contains the laser. The laser output is coupled to an optical fiber 24, in a conventional manner. Laser module 22 is described in more detail below, in connection with FIG. 2.

The operation of laser module 22 is controlled by microprocessor 14 via digital-to-analog converter 30 and automatic power control ("APC") loop 26. Analog switch 32 reads analog signal levels output from RF level measurement circuitry 20 and APC loop 26, as well as a thermoelectric cooler ("TEC") control circuit 28. TEC control circuit 28 is conventional, and controls a thermoelectric cooler to cool the laser in a well known fashion.

The inputs to analog switch 32 are digitized by analog-to-digital converter 34, and coupled to microprocessor 14 via digital I/O interface 36.

Figure 2:
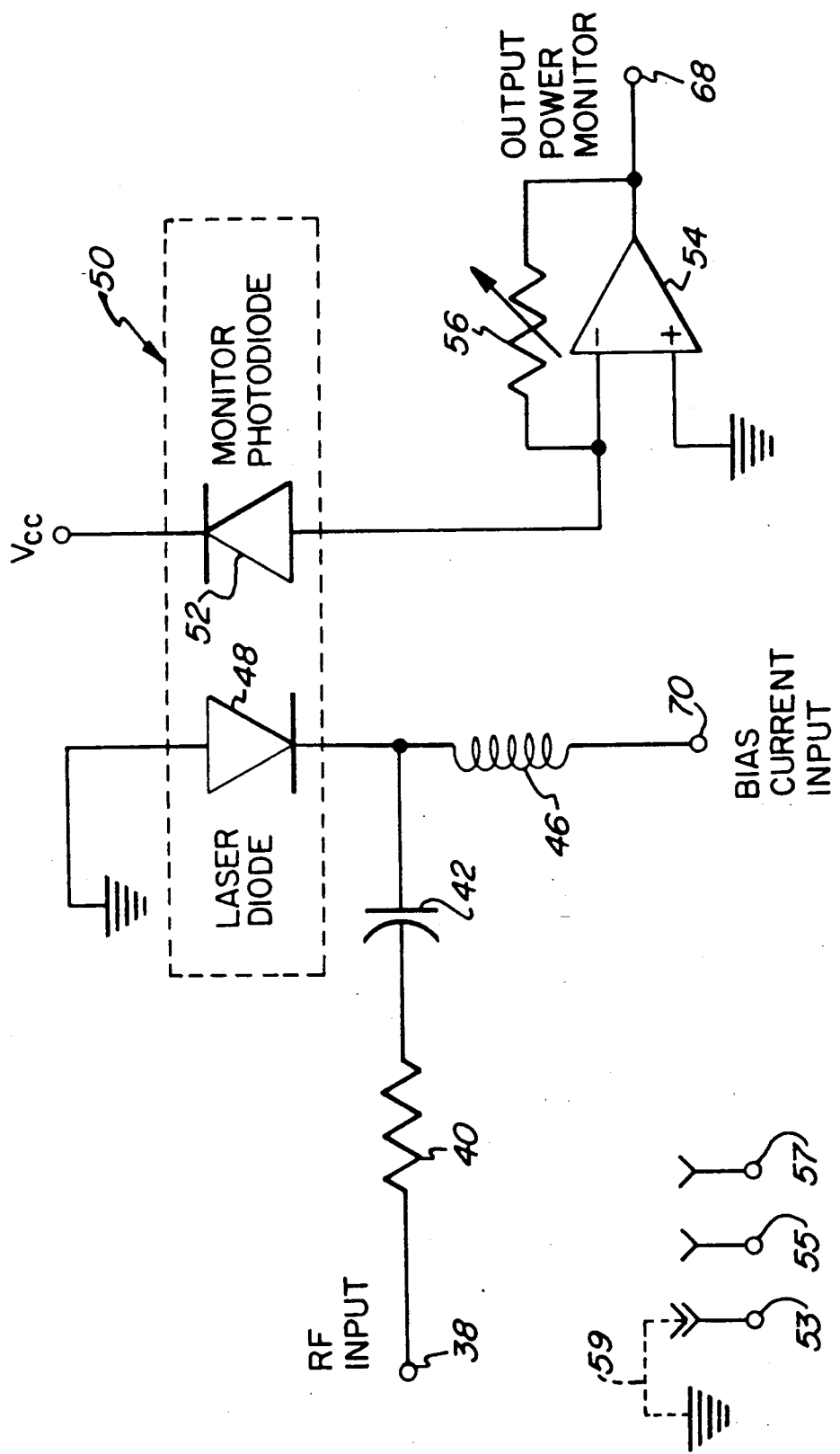
FIG. 2 is a schematic diagram of a laser module in accordance with the present invention.

Turning now to FIG. 2, the laser module 22 is shown in greater detail in schematic diagram form. The RF communication signal from laser protection circuit 18 is input on RF input line 38. A matching resistor 40 combined with the laser impedance produces the laser module input impedance R. A capacitor 42 filters any DC component from the RF input signal, and a choke 46 blocks the RF signal from feeding back into the APC circuitry that provides the laser input bias current $I_{bias}$. A laser package 50 contains laser diode 48 and a monitor photodiode 52 in a conventional manner. Monitor photodiode 52 is used in conjunction with operational amplifier 54 and variable calibration resistor 56 to provide a power monitor, producing an analog signal Pout on line 68 that is indicative of the power output by laser diode 48.

A plurality of terminals 53, 55, 57 is provided to encode, in a form that can be read by microprocessor 14, the rated output power $P_{nom}$ of the laser module. One or more of terminals 53, 55, 57 can be grounded, as indicated at 59, to provide the digital encoding. Alternately, a programmable read only memory ("PROM") or similar device can be used for the digital encoding. A typical rated output power for a laser of the type used in connection with the present invention may be on the order of two milliwatts.

In operation, a laser module may eventually burn out and need to be replaced. The present invention automatically aligns the laser transmitter when a laser module is replaced, to adjust to the characteristics of the new laser module. Microprocessor 14 measures characteristics of the installed laser module, and determines the proper analog signal level required at input 38 of the laser module 22 from the measured characteristics. The actual analog signal level input to the laser module is then measured and adjusted to the calculated level.

Figure 4:
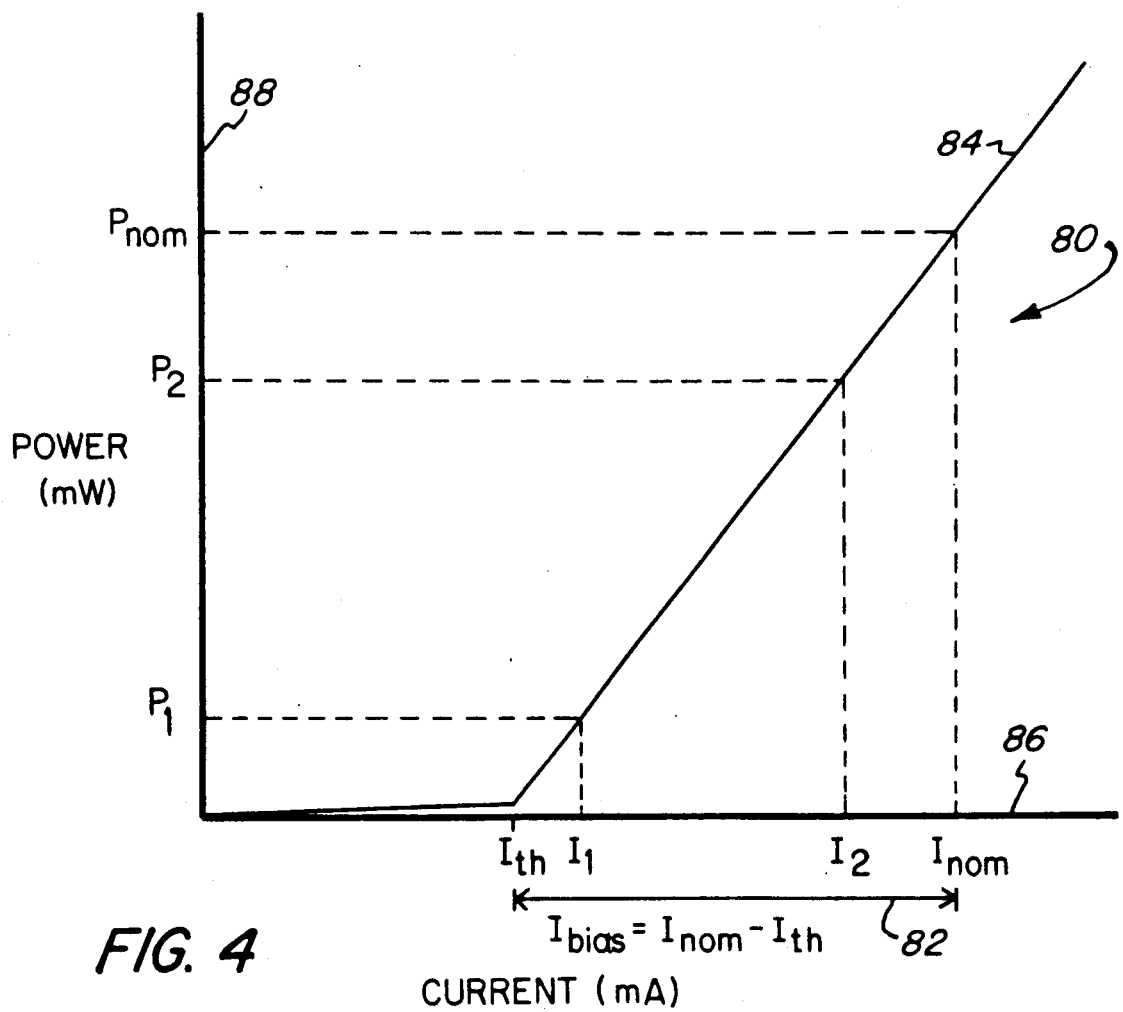
FIG. 4 is a laser diode transfer characteristic (L-I curve)

Operational characteristics of the laser module include the rated output power $P_{nom}$, the threshold current $I_{th}$, and the slope efficiency. The threshold current is the current where the device begins to lase. FIG. 4 illustrates the transfer characteristic, generally designated 80, for laser diode 48. The laser output power is plotted on axis 88 and the bias current applied to the laser diode is plotted on axis 86. As shown, the laser diode has no meaningful output until it reaches the threshold current $I_{th}$, at which point the output power increases along slope 84 as the bias current is increased.

Slope efficiency SE is a measure of how much the laser's output power changes for a given change in drive current. Both the threshold current and the slope efficiency vary from device to device, and these operational characteristics are different for every laser module. Further, these operational characteristics may also change over the life of the laser module. Accordingly, these parameters have to be determined for each laser module so that the optimum analog drive level of a communication signal used to modulate the laser can be determined.

Figure 3:
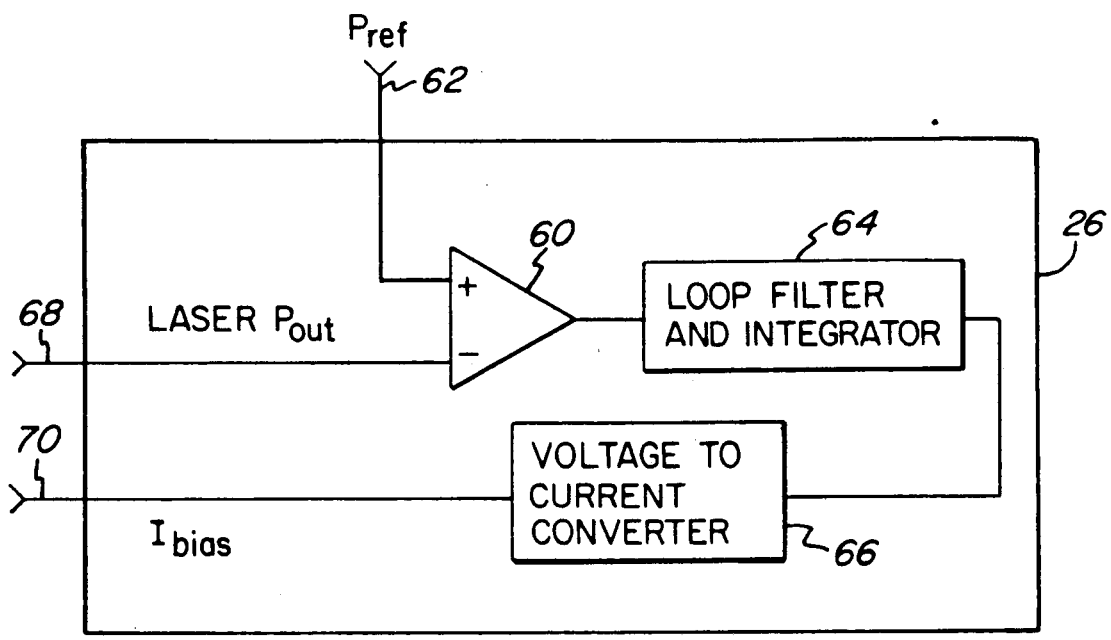
FIG. 3 is a block diagram of automatic power control circuitry which can be used in accordance with the present invention.

In order to determine the slope efficiency of a laser module in accordance with one embodiment of the present invention, microprocessor 14 locates two points on the laser diode transfer characteristic ("L-I curve") 84. The laser diode's bias current is supplied by the automatic power control circuitry 26 of FIG. 1. This circuitry is shown in greater detail in FIG. 3. The laser output power $P_{out}$ on line 68 is input to the negative terminal of error amplifier 60. A reference voltage $P_{ref}$, received from microprocessor 14 on line 62 via D/A converter 30, is applied to the positive terminal of error amplifier 60. If the power reference $P_{ref}$ and the laser output power Pout are at different voltages, the difference is amplified in error amplifier 60 and passed to loop filter and integrator 64, where the error signal is filtered and integrated. This causes the output of the integrator, which is input to voltage-to-current converter 66, to change. As a result, the laser bias current $I_{bias}$ output on line 70 to the laser module changes to ultimately reduce the difference between Pout and $P_{ref}$ to nearly zero. Thus, the automatic power control circuitry controls the bias current to the laser diode in order to maintain a constant output power equal to the power level reference.

Microprocessor 14 determines the laser bias current $I_{bias}$ by controlling the analog switch 32 and A/D converter 34 to read the bias current from a monitor point (i.e., line 70) in the APC loop 26. To determine the slope efficiency, the microprocessor sets the power level reference $P_{ref}$ to one level $P_1$, and measures the laser bias current $I_1$ at that point, as shown in FIG. 4. Microprocessor 14 then sets $P_{ref}$ to a second level $P_2$ and measures the laser bias current $I_2$ at that point. Then, microprocessor 14 calculates the slope efficiency according to the formula:

$$SE = \frac{P_2 - P_1}{I_2 - I_1}$$

The nominal laser bias current $I_{bias}$ is also calculated by the microprocessor directly from the formula:

$$I_{bias} = \frac{P_{nom}}{SE}$$

As noted above, $P_{nom}$ can be read from encoded terminals on the laser module, or can be programmed into microprocessor 14 either when the laser transmitter is manufactured (if the rated output power of the laser module will never be changed) or by a field technician. It is pointed out that the method used to calculate the slope efficiency obviates the need for the microprocessor to determine the value of the laser threshold current $I_{th}$.

The communication signal input to the laser module on line 38 modulates the laser output power by varying the instantaneous laser bias current. The peak modulation current required is a function of the laser's nominal output power $P_{nom}$, the slope efficiency, and the desired total RMS modulation index M. The optimum value of M is determined by the particular application for the transmitter. In a 40 channel AM transmission system, for example, the value of M is roughly 0.3 to 0.35. This value will be programmed into microprocessor 14, or can be read from encoded terminals in a manner similar to that described in connection with $P_{nom}$ and terminals 53, 55, and 57 above. A discussion of the modulation index parameter in connection with fiber optic communication systems is provided in the article "AM Fiber-Optic Trunks" by David Grubb III, *Communications Technology*, October, 1988, and in the paper entitled "AM Fiber Optic Trunks: A Noise and Distortion Analysis", Grubb and Trisno, 1989 *NCTA Technical Papers*.

The RF input power level L that is required to produce the desired modulation depth for the laser transmitter is calculated by microprocessor 14 according to the relationship:

$$L = \tfrac{1}{2}(I_{bias})^2 * R * M^2$$

This relationship may, of course, also be expressed by substituting for $I_{bias}$ as follows:

$$L = \tfrac{1}{2} * (P_{nom}/SE)^2 * R * M^2$$

Once the correct analog signal level L has been determined, microprocessor 14 reads the actual magnitude of a communication signal input to the laser module via RF level measurement circuitry 20, analog switch 32, and A/D converter 34. Then, the communication signal magnitude is adjusted by microprocessor 14 via RF level control 16 to provide the correct RF signal level L for communication across an optical fiber.

Figure 5:
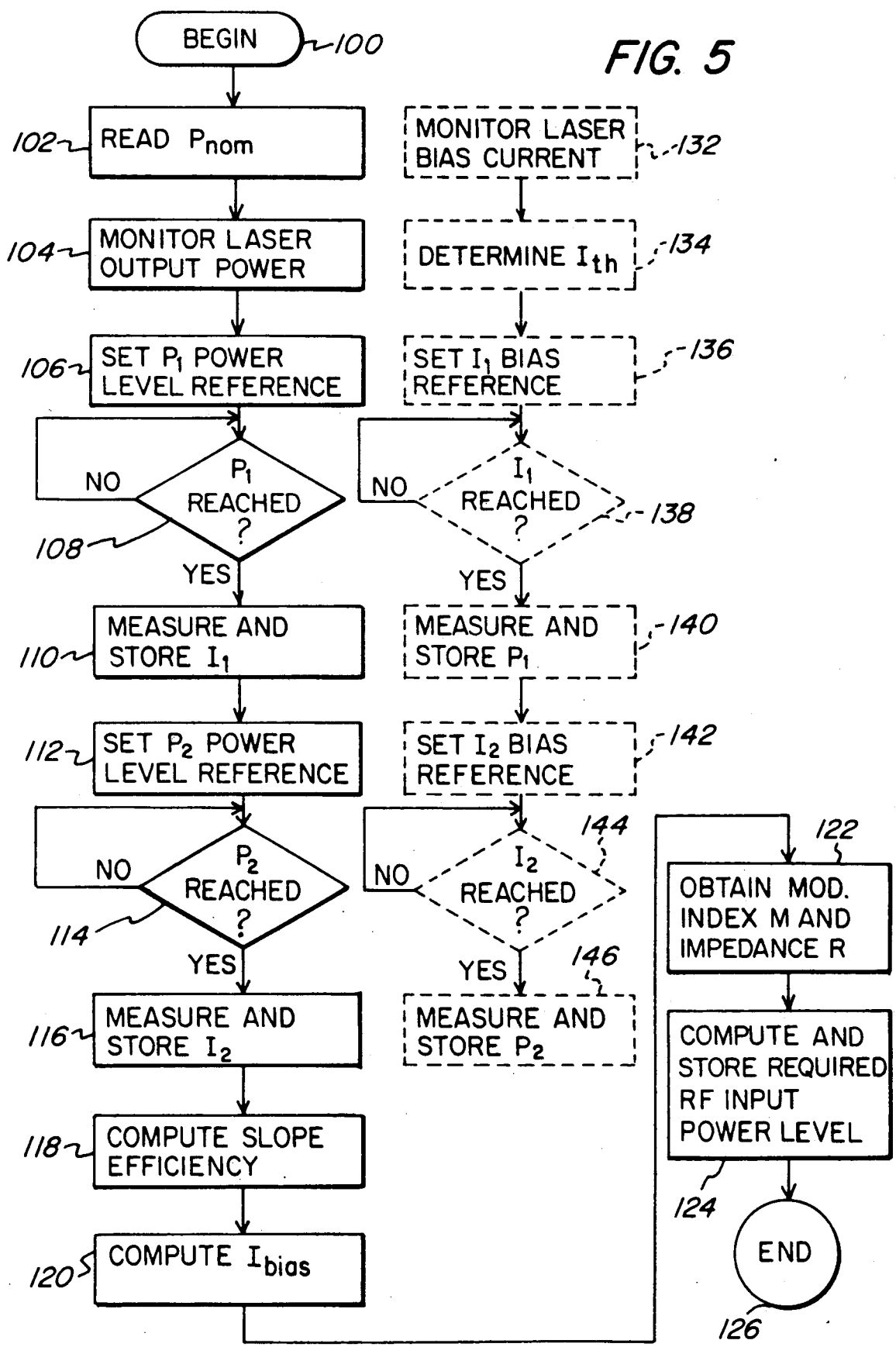
FIG. 5 is a flowchart depicting alternate routines for determining laser operational characteristics in accordance with the present invention.

FIG. 5 is a flow chart illustrating the determination by microprocessor 14 of the RF input power level required to properly modulate the laser transmitter. The routine begins at box 100, and at box 102 microprocessor 14 reads the rated output power $P_{nom}$ of the laser module. As noted above, the value of $P_{nom}$ can be encoded on pins physically located on the laser module, or could alternately be stored in memory associated with microprocessor 14.

At box 104, microprocessor 14 begins to monitor the actual laser output power from the output power monitor circuit of the laser module. As noted above, the output power is output on line 68, and read by the microprocessor via A/D converter 34 and analog switch 32, which receives the power signal from APC loop 26.

At box 106, microprocessor 14 sets an initial power level reference $P_1$. This signal is applied to the error amplifier 60 of APC loop 26 via line 62. The signal on line 62 is an analog signal, which has been converted from the digital signal output from microprocessor 14 by digital-to-analog converter 30.

At box 108, a determination is made as to whether the power level reference $P_1$ has been reached by the laser module. If not, a loop continues until the laser output power on line 68 equals the power level reference established by microprocessor 14. Once this occurs, control passes from box 108 to box 110 and microprocessor 14 measures and stores the value of the bias current $I_1$ input to the laser module on line 70. Then, at box 112, a second power level reference $P_2$ is set by microprocessor 14. At box 114 a determination is made as to whether power level reference $P_2$ has been reached, and when it has, control passes to box 116 where microprocessor 14 measures and stores the bias current input $I_2$ required for power level $P_2$.

At box 118, microprocessor 14 uses the values of $P_1$, $P_2$ and $I_1$, and $I_2$ to compute the slope efficiency of the laser module. Then, at box 120 microprocessor 14 computes the value of $I_{bias}$, which is the bias current above the threshold current that must be applied to the laser for proper operation.

At box 122, microprocessor 14 obtains the modulation index M and the laser input impedance R. These values are stored in memory, and entered by the system designer when the laser system is manufactured. Alternately, these values can be entered into memory by a field technician who replaces a laser module. As noted above, these values could also be encoded in the laser module itself, in a similar fashion to the encoding provided for the laser rated output power $P_{nom}$ described above.

At box 124, microprocessor 14 computes the value of the RF input power level required for proper modulation of the laser for communication across an optical fiber. The computation uses the operational characteristics determined by the microprocessor in the preceding steps. The computed value is stored in memory for subsequent use by the microprocessor, in conjunction with RF level control 16, RF level measurement circuitry 20, and APC loop 26, in maintaining the input power level at the computed value. At box 126, the routine ends.

An alternate embodiment of the routine just described is illustrated by the broken-lined boxes 132 to 146 in FIG. 5. Instead of setting a power level reference and measuring the corresponding bias current, microprocessor 14 can set a bias current reference and measure the corresponding output power. Thus, at box 132 microprocessor 14 monitors the laser bias current. At box 134, the threshold current $I_{th}$ is determined, e.g., by incrementally stepping the current applied to the laser diode from zero up to a point at which a meaningful rise in laser output power is detected. The current at this point is the threshold current, as is evident from the transfer characteristic of FIG. 4. At box 136, a bias reference $I_1$ (above $I_{th}$) is set, and a determination is made at box 138 as to when this current is reached. At that point, the resultant power $P_1$ is measured and stored as indicated at box 140. A bias reference $I_2$ (also greater than $I_{th}$) is set at box 142. At box 144, a determination is made as to when the bias current reaches the reference value $I_2$, at which point control passes to box 146 where the corresponding output power $P_2$ is measured and stored. The subsequent computation of slope efficiency, $I_{bias}$, and the required RF input power level proceeds as before.

Figure 6:
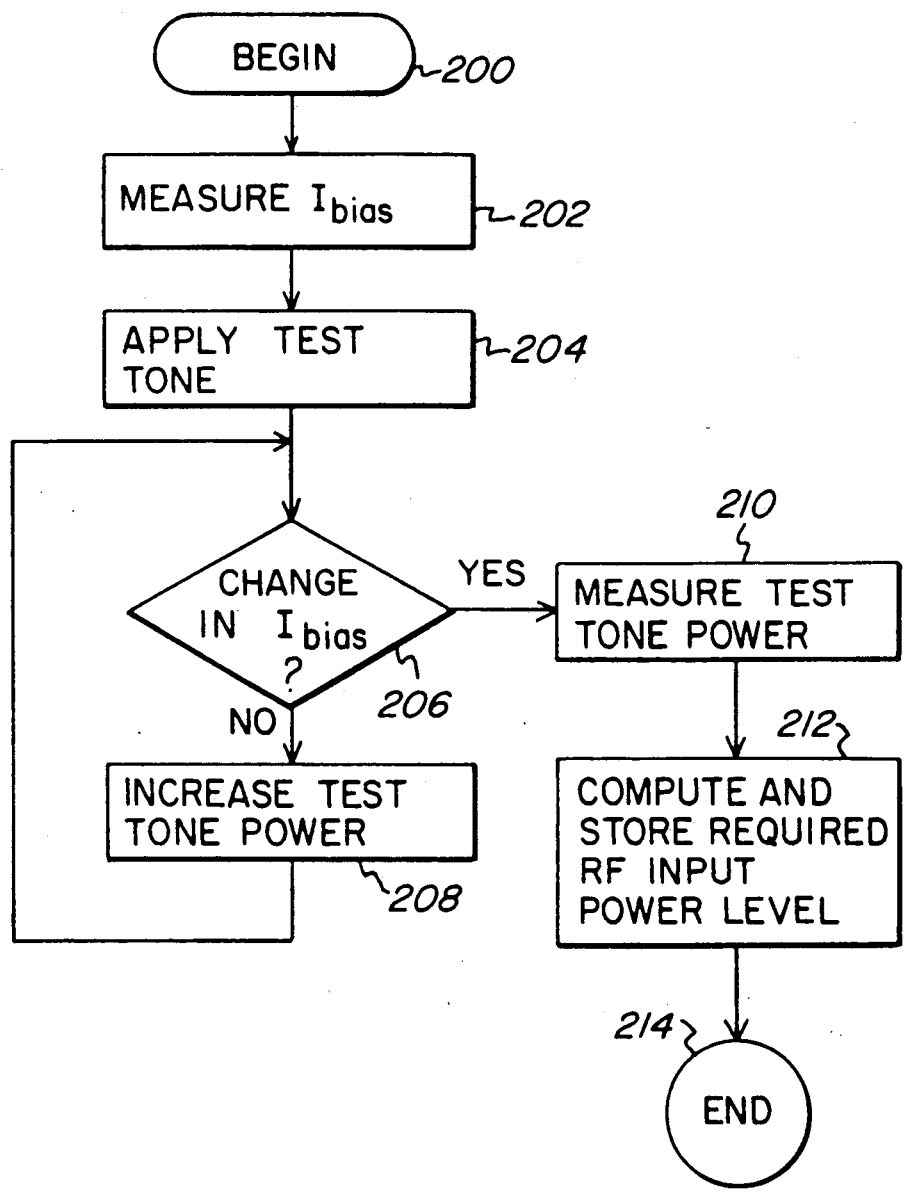
FIG. 6 is a flowchart of another routine for determining laser operational characteristics.

FIG. 6 is a flowchart illustrating a different technique for computing the required RF input power level for proper modulation of the laser. The routine begins at box 200, and at box 202 microprocessor 14 commences measurement of the $I_{bias}$ input to the laser module, on line 70. At box 204, a test tone (e.g., a 10 MHz sine wave) is applied to the RF input of the laser module on line 38. The test tone can be generated by a conventional oscillator circuit which is provided as part of the laser card or elsewhere within the transmitter.

While the test tone is applied, microprocessor 14 looks for a change in the magnitude of the bias input current $I_{bias}$. This is indicated at box 206. If no change is detected, the test tone power is increased at box 208 by a predetermined increment. Control then loops back to box 206, and the test tone power continues to be increased until a change in the bias current is detected. At this point, control passes to box 210 where the magnitude of the test tone power is measured. The test tone power at this point is approximately the power required to operate the laser at 100 percent modulation. $I_{bias}$ changes at the point of overmodulation due to the onset of distortion in the modulated signal. In particular, at the point of overmodulation, the APC loop detects an instantaneous increase in $P_{out}$ caused by the distortion, and tries to compensate by changing $I_{bias}$.

At box 212, the RF input power level required for a desired modulation is computed by scaling the measured test tone power which is indicative of 100 percent modulation. This may be accomplished by using the relationship:

$$L = P100\% * M^2$$

where L is the required input power level, P100% is the measured test tone power indicative of 100% modulation, and M is the modulation index. The computed value is stored, and subsequently used by microprocessor 14 in maintaining the RF input power level at the computed value. At box 214, the routine ends.

The alignment of a laser transmitter in accordance with the present invention can be triggered by a switch that is manually actuated by a technician when a laser module is replaced. This switch can also be actuated periodically to enable the transmitter to compensate for degradation of a laser module's operating characteristics in the normal course of operation. Alternately, a "cheater" switch can be provided which is actuated upon removal and reinstallation of a cover for the laser transmitter. In yet another embodiment, microprocessor 14 can be programmed to periodically implement the alignment routine on a timed basis.

It will now be appreciated that the present invention provides a method and apparatus for the self-alignment of an analog laser transmitter. Operational characteristics of the laser are determined, and used to derive the magnitude of power required for an input communication signal to properly modulate a laser for communication along a fiber optic network. Once this power level has been computed, the power of an actual communication signal applied to the laser transmitter is maintained at this level.

Although the present invention has been described in connection with several preferred embodiments, those skilled in the art will appreciate that numerous adaptations and modifications may be made thereto without departing from the spirit and scope of the invention, as set forth in the following claims.

What is claimed is:

1. Apparatus for aligning an analog laser transmitter to provide proper modulation of a signal for fiber optic communication, comprising:
   a laser having a rated output power $P_{nom}$ and an input impedance R;
   means for monitoring the magnitude of an analog communication signal coupled to modulate said laser;
   means coupled to said laser for determining operational characteristics including the slope efficiency SE thereof;
   means for deriving, from the determined operational characteristics, the level L required of said communication signal to properly modulate said laser for communication across an optical communication path; and
   means for adjusting the magnitude of said communication signal to said level;
   wherein said deriving means comprise:
   means for calculating said level L for a desired modulation index M from the relationship:

$$L = \tfrac{1}{2} * (P_{nom}/SE)^2 * R * M^2.$$

2. The apparatus of claim 1, wherein said operational characteristics further comprise the rated output power of said laser.

3. The apparatus of claim 1, wherein said laser requires an input bias current to produce an output, and said determining means comprise:
   means for measuring the bias current $I_1$ of said laser at one output power level $P_1$ and for measuring the bias current $I_2$ of said laser at another output power level $P_2$; and
   means for computing the slope efficiency SE from the relationship:

$$SE = \frac{P_2 - P_1}{I_2 - I_1}.$$

4. The apparatus of claim 1 wherein said laser requires an input bias current to produce an output, and said determining means comprise:
   means for measuring an output power level $P_1$ of said laser at one bias current $I_1$ and for measuring an output power level $P_2$ of said laser at another bias current $I_2$; and
   means for computing the slope efficiency SE from the relationship:

$$SE = \frac{P_2 - P_1}{I_2 - I_1}.$$

5. The apparatus of claim 1 wherein said operational characteristics comprise the input power magnitude required to operate said laser at 100% modulation.

6. The apparatus of claim 5 wherein said determining means comprise:
   means for applying a test tone to modulate said laser;
   means for gradually increasing the power of said test tone from a relatively low power to a higher power;
   means for monitoring a bias current coupled to said laser during the application of said test tone to the laser;
   means coupled to said monitoring means for detecting a change in said bias current due to overmodulation of said laser by the test tone; and
   means for determining the test tone power when said detecting means detects a change in said bias current;
   wherein the magnitude of the determined test tone power is approximately the input power magnitude required to operate said laser at 100% modulation.

7. The apparatus of claim 6 wherein said deriving means comprise:
   means for computing, from said input power magnitude, the power level required of said communication signal to operate said laser at a desired modulation level.

8. A self aligning analog laser transmitter comprising:
   a computer processor;
   an input terminal for receiving an analog communication signal;
   a laser module having an input coupled to receive said communication signal and an output for transmitting a laser signal modulated by said communication signal over an optical communication path;
   means operatively associated with said computer processor for determining operational characteristics including the slope efficiency SE of said laser module;
   means operatively associated with said computer processor for deriving, on the basis of said characteristics, the power required of said communication signal to modulate said laser at a desired level; and
   means responsive to said computer processor for adjusting the power of said communication signal to said required power;
   wherein said laser module has a rated output power $P_{nom}$ and an input impedance R, and said deriving means derive the required power L for a desired modulation index M from the relationship:

$$L = \tfrac{1}{2} * (P_{nom}/SE)^2 * R * M^2.$$

9. The laser transmitter of claim 8 further comprising:
   means for applying an input bias current to said laser module to cause said laser module to produce a laser output; and
   means for measuring the power of said laser output;
   wherein said determining means obtains a set of bias current and output power characteristics for said laser module, said set including a bias current $I_1$, that produces an output power $P_1$, and a bias current $I_2$ that produces an output power $P_2$, to determine the slope efficiency SE of said laser module according to the relationship:

$$SE = \frac{P_2 - P_1}{I_2 - I_1}.$$

10. The laser transmitter of claim 8 further comprising:
    means for computing a nominal laser bias current to be applied to said laser module when communicating over an optical fiber; and
    means for applying the computed current to the laser module during a fiber optic communication.

11. The laser transmitter of claim 10 wherein said nominal laser bias current $I_{bias}$ is computed according to the formula:

$$I_{bias} = \frac{P_{nom}}{SE}.$$

12. The laser transmitter of claim 8 further comprising:
    means for applying an input bias current to said laser module to cause said laser to produce a laser output; and
    wherein said determining means comprise:
    means for applying a test tone to said input terminal;
    means for gradually increasing the power of said test tone from a relatively low power to a higher power;
    means for monitoring said input bias current during the application of said test tone to the input terminal;
    means coupled to said monitoring means for detecting a change in said bias current due to overmodulation of said laser by the test tone; and
    means for determining the test tone power when said detecting means detects a change in said bias current;
    wherein the magnitude of the determined test tone power is an operational characteristic indicative of the power required to operate said laser module at 100% modulation, and is used by said deriving means to derive the power required of said communication signal.

13. A method for aligning an analog laser transmitter to provide proper modulation of a signal for fiber optic communication comprising the steps of:
    determining operational characteristics of a laser;
    deriving from said operational characteristics a power level L required of an analog communication signal to properly modulate said laser for communication across an optical communication path;

monitoring the magnitude of an analog communication signal coupled to modulate said laser; and adjusting the magnitude of said communication signal to the derived power level;

wherein the slope efficiency SE of said laser is determined at said determining step, and said power level L is calculated at said deriving step in accordance with the relationship:

$$L = \tfrac{1}{2} * (P_{nom}/SE)^2 * R * M^2$$

wherein $P_{nom}$ is the rated output power of said laser, R is the input impedance of said laser, and M is a desired modulation index.

14. The method of claim 13 wherein the magnitude of a communication signal required to operate said laser at 100% modulation is determined at said determining step, and the power level derived at said deriving step is computed from said determined magnitude.

15. The method of claim 13 comprising the further steps of:

computing a nominal laser bias current to be applied to said laser during a communication across an optical fiber; and applying said current to said laser during a fiber optic communication to cause the laser to produce a laser output.

16. Apparatus for aligning an analog laser transmitter to provide proper modulation of a signal for fiber optic communication, comprising:

a laser;

means for coupling an analog communication signal to an input terminal of said laser to modulate the laser;

means independent of said laser for directly monitoring the magnitude of said analog communication signal in the electrical domain without reliance on an optical output of said laser;

means coupled to said laser for determining operational characteristics thereof;

means for deriving, from the determined operational characteristics, the level required of said communication signal to properly modulate said laser for communication across an optical communication path; and means responsive to said monitoring means for adjusting the magnitude of said analog communication signal to said level.

* * * * *